US008223580B2

(12) United States Patent
Parkinson

(10) Patent No.: US 8,223,580 B2
(45) Date of Patent: Jul. 17, 2012

(54) METHOD AND APPARATUS FOR DECODING MEMORY

(75) Inventor: Ward Parkinson, Boise, ID (US)

(73) Assignee: Ovonyx, Inc., Sterling Heights, MI (US)

( * ) Notice: Subject to any disclaimer, the term of this patent is extended or adjusted under 35 U.S.C. 154(b) by 811 days.

(21) Appl. No.: 12/214,144

(22) Filed: Jun. 17, 2008

(65) Prior Publication Data

US 2009/0310402 A1 Dec. 17, 2009

(51) Int. Cl.
*G11C 8/10* (2006.01)
(52) U.S. Cl. ............ 365/230.06; 365/163; 365/148
(58) Field of Classification Search .......... 365/163, 365/148, 230.06
See application file for complete search history.

(56) References Cited

U.S. PATENT DOCUMENTS

| | | | | |
|---|---|---|---|---|
| 3,851,398 A * | 12/1974 | Hilburger | ............... | 33/501.09 |
| 4,807,974 A * | 2/1989 | Hirai | ............... | 345/96 |
| 5,484,311 A * | 1/1996 | Detwiler et al. | ............... | 440/61 R |
| 5,694,054 A * | 12/1997 | Ovshinsky et al. | ............... | 326/35 |
| 5,773,309 A * | 6/1998 | Weiner | ............... | 438/166 |
| 6,940,770 B2 * | 9/2005 | Ku et al. | ............... | 365/203 |
| 2005/0058941 A1 * | 3/2005 | Yamada et al. | ............... | 430/270.11 |
| 2005/0093043 A1 * | 5/2005 | Morita et al. | ............... | 257/295 |
| 2006/0002173 A1 * | 1/2006 | Parkinson et al. | ............... | 365/148 |
| 2006/0097760 A1 * | 5/2006 | Hori | ............... | 327/108 |
| 2006/0226410 A1 * | 10/2006 | Wicker et al. | ............... | 257/2 |
| 2007/0211535 A1 * | 9/2007 | Kim | ............... | 365/185.21 |
| 2008/0084735 A1 * | 4/2008 | Parkinson | ............... | 365/163 |
| 2008/0112217 A1 * | 5/2008 | Karpov et al. | ............... | 365/163 |
| 2009/0027951 A1 * | 1/2009 | Kau | ............... | 365/163 |

OTHER PUBLICATIONS

Kenneth E. Van Landingham, "Circuit Applications of Ovonic Switching Devices", Feb. 1973, IEEE Transactions on Electron Devices, vol. ED-20, No. 2, pp. 178-187.*

* cited by examiner

*Primary Examiner* — Hoai V Ho
*Assistant Examiner* — Jay Radke
(74) *Attorney, Agent, or Firm* — Kevin L. Bray

(57) ABSTRACT

A thin-film memory may include a thin-film transistor-free address decoder in conjunction with thin-film memory elements to yield an all-thin-film memory. Such a thin-film memory excludes all single-crystal electronic devices and may be formed, for example, on a low-cost substrate, such as fiberglass, glass or ceramic. The memory may be configured for operation with an external memory controller.

25 Claims, 7 Drawing Sheets

METHOD AND APPARATUS FOR DECODING MEMORY

FIELD OF INVENTION

This invention relates to electronic memory circuits.

BACKGROUND OF THE INVENTION

As electronic memories approach limits beyond which they will no longer be able to produce the density/cost/performance improvements so famously set forth in Moore's law, a host of memory technologies are being investigated as potential replacements for conventional silicon complementary metal oxide semiconductor (CMOS) integrated circuit memories. Among the technologies being investigated are phase change memory technologies. Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In the chalcogenides, the resistivity may change by two or more orders of magnitude when the material passes from the amorphous (more resistive) phase to the crystalline (more conductive) phase, and vice versa. Further, the resistivity of the chalcogenide materials generally depend on the temperature with the amorphous state generally being more temperature dependent than the crystalline state.

A chalcogenide memory device may utilize the wide range of resistance values available for the material as the basis of memory operation. Each resistance value corresponds to a distinct structural state of the chalcogenide material and one or more of the states can be selected and used to define operation memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then cool it off rapidly, i.e. quench. From the electrical standpoint, it is possible to reach the crystallization and melting temperatures by causing a current to flow through a crystalline resistive element that heats the chalcogenic material by the Joule effect.

Each memory state of a chalcogenide memory material corresponds to a distinct range of resistance values and each memory resistance value range signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market, devices also described as PCM or Phase Change Memory. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in *Science News*, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may be deposited with a reactive sputtering process with gasses such as $N_2$ or $O_2$ $N_2$ or $O_2$: forming a chalcogenide nitride, or oxide, for example and chalcogenide may be modified by an ion implantation or other process.

Early work in chalcogenide devices demonstrated electrical switching behavior in which switching from an "off" resistive state to an "on" conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference.

Although highly efficient and cost effective, process methods and device structures that reduce the cost of phase change memories would be highly desirable.

SUMMARY OF THE INVENTION

A method and apparatus in accordance with the principles of the present invention employs a thin-film transistor-free decoder to address memory cells. The decoder may employ diodes (which may be thin-film diodes) or other devices, such as ovonic threshold switches (OTSes) to activate OTS devices that provide access to a memory cell. In an illustrative embodiment, a plurality of phase change memory cells, such as ovonic universal memory (OUM) memory cells, are arranged in an array and a decoder in accordance with the principles of the present invention provides access to memory cells within the array.

In an illustrative embodiment, a memory in accordance with the principles of the invention employs thin-film address decoding with thin-film memory to yield a standalone circuit that includes memory and peripheral circuitry, all of which is thin-film. For the purposes of this discussion, a "standalone circuit" means an integrated electronic circuit that is configured to accept one or more inputs from, and provide one or more outputs to, one or more separately packaged electronic devices. Each standalone circuit typically includes input and output structures such as pads for connection to external circuits and input and output drivers connected to those pads for communication with circuits external to the standalone circuit. Various packaging schemes may be employed with such a standalone circuit, including hybrid packaging, conventional bump bonding, chip-on-board, single-in-line packaging, dual-in-line packaging, for example. Whatever packaging scheme is employed, the standalone circuit includes input and output drivers connected to pads employed for interconnection with other electronic circuits.

In an illustrative embodiment, a standalone thin-film memory circuit in accordance with the principles of the present invention includes an array of phase change memory cells and thin-film peripheral circuitry that, in combination, yields a standalone thin-film memory circuit. A memory in accordance with the principles of the present invention includes thin-film address decoders configured to access a memory cell within an array of memory cells. Such an access may involve reading from the memory cell or writing to the memory cell, for example. In an illustrative embodiment, thin-film devices are employed as both row and column address decoding devices.

In an illustrative embodiment one or more standalone thin-film memories in accordance with the principles of the present invention may be deposited on a non-crystalline substrate. Such a non-crystalline substrate may be a glass or ceramic, for example, and a plurality of standalone devices in accordance with the principles of the present invention may be joined via interconnecting conductive lines patterned on the substrate, for example.

A standalone thin-film memory in accordance with the principles of the present invention may be particularly suitable for operation in a variety of electronic devices, including cellular telephones, radio frequency identification devices (RFID), computers (portable and otherwise), location devices (e.g., global positioning system (GPS) devices, particularly those that store and update location-specific information), and handheld electronic devices, including personal digital assistants (PDAs), and entertainment devices, such as MP3 players, for example.

DETAILED DESCRIPTION

Figure 1:
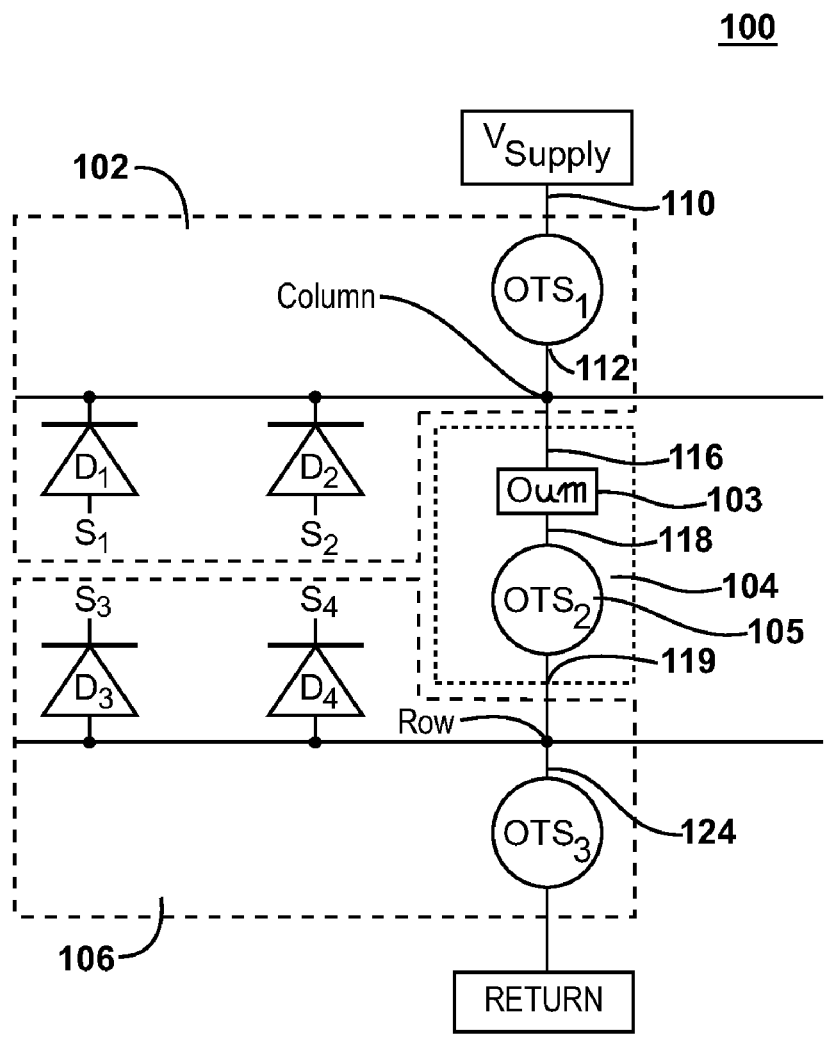
FIG. 1 is a block diagram of a thin-film memory in accordance with the principles of the present invention.

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Polarities and types of devices and supplies may be substituted in a manner that would be apparent to one of reasonable skill in the art. Although circuits are generally described in terms of diode logic decoding, diodes may be conventional, crystalline diodes or thin-film diodes. Other devices, such as an ovonic threshold switch (OTS) may be used to replace some or all of the diodes to provide address decoding in accordance with the principles of the present invention. Accordingly, the scope of the invention is defined only by reference to the appended claims.

In an illustrative embodiment, a memory in accordance with the principles of the present invention couples thin-film peripheral circuitry with thin-film memory to yield a circuit that includes memory and peripheral circuitry, all of which is rendered using thin-film processes and structure. That is, a circuit that includes one or more memories in accordance with the principles of the present invention is produced by one or more thin-film processes, such as sputtering or deposition, and the resulting structure of a memory in accordance with the principles of the present invention includes thin-film layers of polycrystalline and/or amorphous materials formed into thin-film memory cells and associated peripheral circuitry without any single-crystal structures or devices. Such a memory may be in the form of a standalone memory or may be embedded with additional circuitry, such as, for example, a microprocessor. Whether in a standalone or embedded configuration, a memory in accordance with the principles of the present invention may be used in combination with a controller and other system components, as described in greater detail in the discussion related to FIG. 7. Thus the thin-film standalone circuits of the present invention do not require bulk single crystal silicon or other elemental or compound single crystal materials. Additionally, single crystal devices such as diodes, MOS transistors, BJT transistors, and SCR devices may be employed but are not required to co-exist on the same substrate with the thin-film standalone circuits. Some or all of the memory, logic, and other functions on a given chip are thus performed by thin-film devices formed by sequential deposition and patterning of thin-film materials. The thin-film devices may be used alone or in combination with more conventional, crystalline, integrated circuit components, such as transistors, substrate diodes (including those made by shorting a FET's gate to drain), and epitaxial diodes. Example thin-film devices include, thin-film diodes fabricated by depositing doped or undoped (poly)silicon followed by temperature steps, doping, and/or rapid thermal anneals to improve diode characteristics such as leakage. Example thin-film materials include, chalcogenide materials (e.g. GeSbTe 225), interconnect conductive materials (e.g. Al, Cu, W), electrode materials (e.g. C, TiAlN, TiSiN, TiN), and insulators (e.g. SiO2, SiNx, Al2O3), and OTS material AsGeInSiTe 35/7/0.25/18/40.

For the purposes of this discussion, a "standalone circuit" refers to an integrated electronic circuit that is configured to accept at least one input from, and provide at least one output to, at least one other electronic device. Each standalone circuit typically includes input and output structures, such as pads for connection to external circuits and input and output drivers connected to those pads for communication with circuits external to the standalone circuit. Various packaging schemes may be employed with such a standalone circuit, including hybrid packaging, conventional bump bonding, chip-on-board, single-in-line packaging, dual-in-line packaging, for example.

A phase change memory 100 that employs thin-film transistor-free address decoding in accordance with the principles of the present invention is depicted in the schematic diagram of FIG. 1. Components, such as sense amplifiers used for reading a phase change memory and current sources employed to write to phase change memories, that may be in series with Vsupply or Return, are not included in this view of the phase change memory 100, but their combination with the circuitry of this illustrative embodiment will be apparent to those of skill in the art, and such circuits may be located on the same chip as the memory or diode/ots logic or off chip such as on a controller using means and partitioning for performance and cost tradeoffs as are familiar to those reasonably skilled in the art. Such components, particularly if single-crystalline, may be located "off-chip" in embodiments of all-thin-film memory in accordance with the principles of the present invention.

The memory 100 includes a first thin-film transistor-free decoder/OTS driver combination 102, a phase change memory cell 104, and a second thin-film transistor-free decoder/OTS driver combination 106. In this illustrative embodiment, memory cell 104 is in series with two thin-film transistor-free decoder/OTS driver combinations. One thin-film transistor-free decoder/OTS driver combination, when selected by the decoder, turns on in series with positive supply Vsupply and operates as a column select device in an illustrative memory array. As will be understood by one of skill in the art, the column select thin-film transistor-free decoder/OTS driver combination would typically be distributed to a plurality of memory cells within an array of memory cells.

The other thin-film transistor-free decoder/OTS driver combination turns on in series with the RETURN (negative) supply, and operates as a row select device in an illustrative memory array. As will be understood by one of skill in the art, the row select thin-film transistor-free decoder/OTS driver combination would typically be distributed to a plurality of memory cells within an array of memory cells in a distribution orthogonal to that of the column select combination, thereby yielding a crosspoint row/column memory cell selection apparatus.

In this illustrative embodiment, the first thin-film transistor-free decoder/OTS combination 102 includes an OTS device $OTS_1$ connected at a first terminal 110 to a positive voltage supply Vsupply and a second terminal 112 connected to the cathodes of diodes $D_1$ and $D_2$ and to an input terminal 116 of a phase change cell 104 serving as a memory storage element. Either the positive or negative supply voltage may be regulated, such as through use of a band-gap regulator on or off chip. The phase change memory (PCM) cell 104 includes an Ovonic Universal Memory (OUM) element 103 and an OTS device $OTS_2$ 105 connected in series. The OTS device $OTS_2$ 105 operates as an isolation device, such as is known in the art. Other isolation devices (also referred to as access or selection devices), such as a diode or transistor, for example, may be employed in a memory in accordance with the principles of the present invention. Such isolation devices may be employed in combination with positive or negative supplies and a diode decoder and OTS select device to select the column or row, for example.

In the illustrative embodiment of FIG. 1, a first terminal 118 of the OTS device $OTS_2$ is connected to the second terminal of the OUM element 103. The second terminal 119 of the OTS device $OTS_2$ is connected to the anodes of diodes $D_3$ and $D_4$ and to a first terminal 124 of a third OTS device $OTS_3$. The second terminal of the OTS device $OTS_3$ is connected to a return supply. The series order of the OUM and OTS2 in the memory cell may be reversed.

Although Vsupply and RETURN could be, respectively, a fixed voltage source and return, as will be described in greater detail in the discussion related to FIG. 2, in an illustrative embodiment, Vsupply and RETURN are switched in order to reduce power consumption and to provide the appropriate signal magnitude and duration for accessing (e.g., reading, writing a 1, writing a 0, writing other values).

In accordance with the principles of the present invention, signals $S_1$, $S_2$, $S_3$, and $S_4$, respectively presented to diodes $D_1$, $D_2$, $D_3$, and $D_4$, may be combinations of address signals and their complements. As described in greater detail in the sixteen-cell illustrative example of FIG. 3, address signals (denoted: $A_1, A_2$ herein) and their complements (denoted: $A_{1BAR}$, $A_{2BAR}$ herein) may be provided in appropriate combinations to uniquely select individual memory cells within an array as determined by connections of the selected address lines to the decoding diodes (or OTS devices if used instead). As will be described in greater detail in the discussion related to FIG. 2, a memory cell, such as memory cell 104, is accessed by triggering (also referred to herein as thresholding) the "outlying" OTS devices (devices $OTS_1$ and $OTS_3$ in this illustrative embodiment). The outlying OTS devices, once triggered, thereafter exhibit low impedance until untriggered by lowering the current below Ihold. With both $OTS_1$ and $OTS_3$ in low impedance states, the potential between Vsupply and RETURN is imposed across the memory cell 104 and the cell 104 is accessed (e.g., read from or written to) according to the magnitude and profile of the waveform exhibited by the difference: Vsupply−RETURN.

As will be described in greater detail in the discussion related to FIG. 3, the node to which the cathodes of diodes $D_1$ and $D_2$ are connected, labeled "COLUMN", may be distributed to a plurality of memory cells and operate as a column line in a memory array. Similarly, the node to which the anodes of diodes $D_3$ and $D_4$ are connected, labeled "ROW", may be distributed to a plurality of memory cells and operate as a row line in a memory array. By such means, an x-y matrix of cells may be supplied and each cell may be uniquely accessed using the decoder shown with the OTS on each column and/or an OTS plus decoder on each row.

In operation, with either diode $D_1$ or $D_2$ forward-biased by either respective input signal $S_1$ or $S_2$ having a "HI" value, the COLUMN node will be clamped at a level equal to the HI input voltage on the address line ($S_n$) minus a diode drop. With the COLUMN node at that level, the voltage across $OTS_1$ will be less than the threshold voltage of $OTS_i$, even with Vsupply at the maximum positive supply voltage, and $OTS_1$ will not trigger. Similarly, with either diode $D_3$ or $D_4$ forward-biased by either respective input signal $S_3$ or $S_4$ having a "LO" value, the ROW node will be clamped at a level equal to the LO input voltage of the address line ($S_n$) plus a diode drop. With the ROW node at that level, the voltage across $OTS_3$ will be less than the threshold voltage of $OTS_3$, even with RETURN at the minimum negative supply voltage, and $OTS_3$ will not trigger. This is the signal configuration of an un-selected memory cell.

On the other hand, with both diodes $D_1$ and $D_2$ reverse-biased by respective input signals $S_1$ and $S_2$ having a "LO" value, the COLUMN node will be discharged to a LO level by reverse leakage current through the diodes $D_1$ and $D_2$. With the COLUMN node at a LO value, $OTS_1$ will be triggered to a low impedance state with the application of a sufficiently high Vsupply voltage (i.e., with Vsupply-Vcolumn greater than or equal to the threshold voltage of $OTS_1$ ($V_{THOTS1}$)). This combination, in effect, yields a NOR column selection. That is, with all inputs to the diodes low, the diodes are reverse-biased and the column node is discharged to a low level (low enough, that is, to trigger the $OTS_1$)—a NOR operation. This operation eventually triggers the $OTS_1$ and impresses the positive supply voltage upon the column node. Similarly, with both diodes $D_3$ and $D_4$ reverse-biased by both respective input signals $S_3$ and $S_4$ having a "HI" value, the ROW node will be charged by reverse leakage current from the diodes to a level sufficient to trigger the $OTS_3$ (i.e., $V_{ROW}-V_{RETURN}$ greater than or equal to the threshold voltage of $OTS_3$ ($V_{THOTS3}$)). This combination, in effect, yields an AND row selection. That is, with all inputs to the diodes high, the diodes are reverse-biased and the row node is charged to a "high" level (high enough, that is, to trigger the $OTS_3$)—an AND operation. This operation eventually triggers the $OTS_3$ and completes a return conduction path to the row node.

With both $OTS_1$ and $OTS_3$ triggered, $OTS_1$ and $OTS_3$ present low impedance paths and substantially the entire voltage, $V_{supply}-V_{return}$, falls across the memory cell 104. This is the signal configuration of a selected memory cell. In accordance with the principles of the present invention, different supply voltages may be employed for different operations. For example, the value of $V_{supply}$ for a READ operation may be lower than the value of $V_{supply}$ for a WRITE operation; the value of $V_{supply}$ for a WRITE 0 operation may be different from the value of $V_{supply}$ for a WRITE 1; etc. Additionally, the wave shapes, in particular, the trailing edges, of such pulses may vary according to the operation being performed. The supply voltage $V_{supply}$ may be provided from "off-chip" in the form of a pulse in either case. Additionally, the amplitude of such a pulse may be modified to allow for array drops depending upon the location of the cell along the row or column line. The RETURN supply is the more negative of the two supplies and, in many implementations may be 0V, or "ground." The operating margin for a circuit such as this may be improved by engineering the $V_{th}$(ots) and $V_{th}$(oum) and address line levels targeted, for example, as:

For Read:

$$V_{supply}-(V_hOTS_1+V_hOTS_3)<V_{th}OTS_2+V_{th}OUM$$

$$V_{addressH}-V_{diode}>V_{supply}-V_{th}(OTS_1)$$

$$V_{addressL}+V_{diode}<V_{return}+V_{th}(OTS1)$$

Similarly for Write,
$V_{supply}-(V_hOTS_1+V_hOTS_3)>V_{th}OTS_2+V_{th}OUM$ (current limited to the appropriate current to write reset with a fast trailing edge or write set with a slow trailing edge)

$$V_{addressH}-V_{diode}>V_{supply}-V_{th}(OTS_1)$$

$$V_{addressL}+V_{diode}<V_{return}+V_{th}(OTS_1)$$

Where:
$V_{addressH}$=the voltage of an address line driven to a logic "HI"
$V_{addressL}$=the voltage of an address line driven to a logic "LO"
$V_hOTS_1$=the hold voltage of $OTS_1$
$V_hOTS_3$=the hold voltage of $OTS_3$
$V_{th}OTS_2$=the threshold voltage of $OTS_2$
$V_{th}OUM$=the threshold voltage of OUM
$V_{diode}$=the forward diode drop of a diode As previously indicated, in an illustrative embodiment two-terminal OTS devices may be used, rather than diodes (e.g., substitute two-terminal OTS devices for diodes $D_1$, $D_2$, $D_3$, and $D_4$), to perform the address decoding function just described and described in greater detail in the discussion related to FIG. 3. A similar analysis applies to the use of two-terminal OTS devices in a thin-film transistor-free address-decoding apparatus in accordance with the principles of the present invention.

A plurality of row and column selection diode logic/OTS combinations, such as combinations 102 and 106, may be employed to select memory cells in a "crosspoint" manner, whereby only a cell with both its row and column devices activated is accessed. That is, a plurality of cells like 104 may be wired in parallel to terminal 112 and, similarly, a plurality of other cells like 104 may be wired in parallel to terminal 124. Each cell is different in that it uniquely couples to one of many column lines 112 and one of many row lines 124. As will be described in greater detail below, the thin-film transistor-free decoder/OTS combinations 102 and 106 operate to redistribute the proportion of the voltage difference between Vsupply and Vreturn and, in that manner, access the memory cell 104 for reading or writing to a "1" or "0" (or, in a multi-level cell (MLC) implementation, writing to multiple levels, such as "00," "01," "10," or "11," for example). Because the decoder and array are implemented using thin-films, and the thin-film layers may be stacked, a plurality of memory/decoder layers may be formed on the same chip. Additionally, any or all of the layers may employ MLC operation.

Because the thin-film transistor-free decoder/OTS driver combinations 102 and 106 can sink or source far more current than a transistor of comparable size, use of a thin-film transistor-free decoder/OTS driver combination in accordance with the principles of the present invention may significantly reduce the area within an integrated circuit memory that must be dedicated to circuitry that provides row and/or column access to the load, here shown as one or more memory cells. For example, a thin-film transistor-free decoder/OTS combination in accordance with the principles of the present invention may occupy only sixteen lambda squares, while a transistor capable of sinking or sourcing the same current (or adequate load current) occupies 400 squares or more. Conventional logic employed to decode the addresses would require considerably more area and would require the use of expensive single-crystalline devices as well. Through the use of the thin-film decoder driver, the stacked layers may include the decoders (diodes or OTS in place of diodes) and drivers (OTS alone or OTS with transistors for one or more of the drivers).

Although the illustrative configuration of FIG. 1 includes two thin-film transistor-free decoder/OTS driver combinations for phase change memory cell 104, as will be described in more detail in the discussion related to FIG. 4, thin-film transistor-free decoder/OTS combinations may be shared among a plurality of phase change memory cells.

Figure 2:
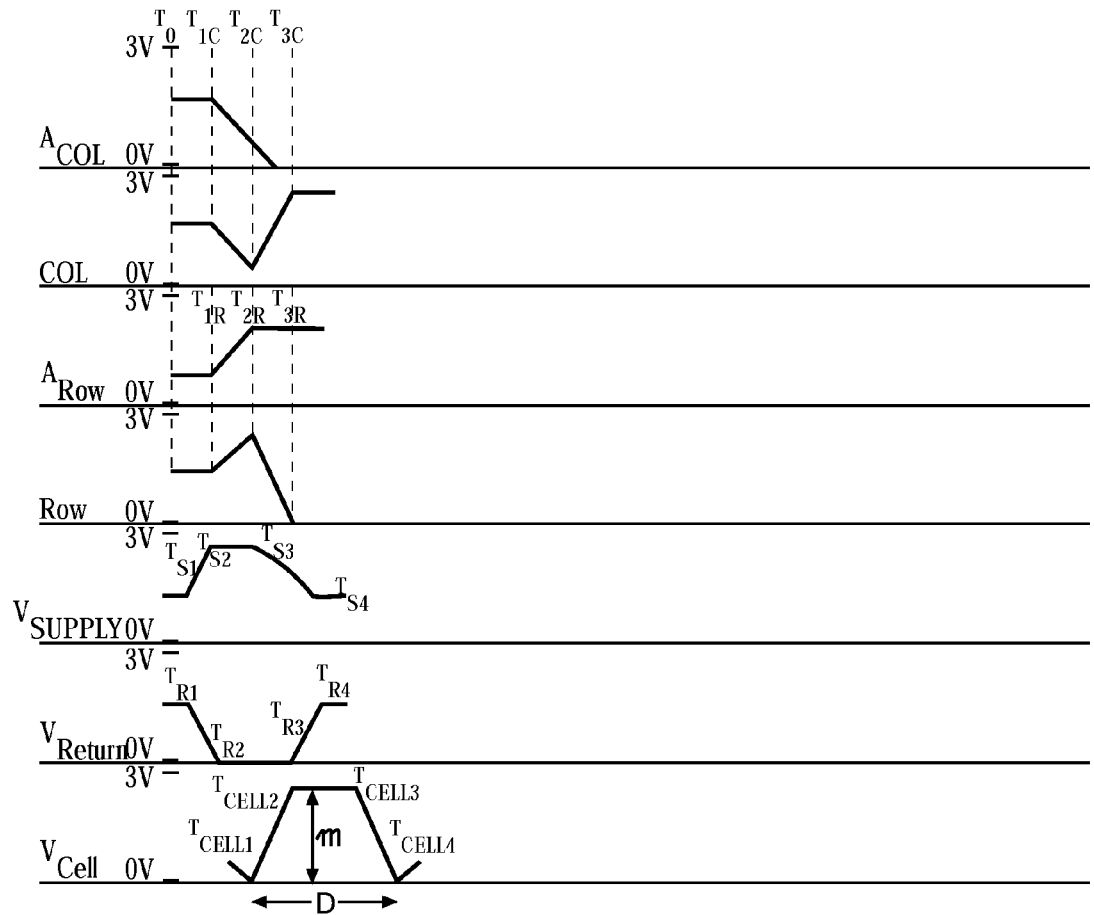
FIG. 2 is a series of plots of voltage versus time for various points in a memory cell in accordance with the principles of the present invention.

The timing chart of FIG. 2 may be viewed to better understand operation of the memory circuit of FIG. 1. In the illustrative embodiment of FIG. 1, thin-film transistor-free decoder/OTS driver combinations in accordance with the principles of the present invention are configured to controllably provide low impedance connection to Vsupply and Return, respectively, for the positive and negative terminals of memory cell 104 (that is, memory element 103 in series with isolation device $OTS_2$). In FIG. 2, voltages corresponding to signals at the column address lines $A_{COL}$, at the row address lines $A_{ROW}$, at the column node COL, at the row node ROW, at the supply input $V_{SUPPLY}$, at the return input $V_{RETURN}$, and across the memory cell $V_{CELL}$, are plotted against time.

In this illustrative embodiment, at their extremes, the supply voltages, $V_{SUPPLYMAX}$ and $V_{RETURNMIN}$, may be, for example, 3.0V and 0.0V, respectively. In accordance with the principles of the present invention all the voltages may be maintained at an intermediate value ($V_{SUPPLYMAX}/2$, for example, where $V_{SUPPLYMAX}$ is the maximum value) while "inactive" (e.g., between memory accesses). In the alternative, the charge supplied to the selected memory cell(s) through the selected (low impedance) OTS devices may be from a variable current source rather than a voltage for more precise reading and writing.

At time $T_0$ the column address lines (true and complement) $A_{COL}$, the row address lines (true and complement)$A_{ROW}$, the column node COL, the row node ROW, the supply input $V_{SUPPLY}$, and the return input $V_{RETURN}$ are all at $V_{SUPPLYMAX}/2$ (1.5V in this illustrative embodiment). The voltage across the memory cell, $V_{CELL}$ is zero volts.

At time $T_{1C}$ the column address lines (signals $S_1$ and $S_2$ in the illustrative embodiment of FIG. 1) begin their descent towards 0V, reverse-biasing the decoding devices (diodes $D_1$ and $D_2$ in the illustrative embodiment of FIG. 1). Reverse-biasing the diodes $D_1$ and $D_2$ establishes a reverse bias leakage current which drains the COLUMN node from 1.5V toward 0V, as indicated by the traces labeled $A_{COL}$ and COL. A similar process takes place with the row address lines increasing in voltage, reverse-biasing the diodes $D_3$ and $D_4$ and charging the ROW node with reverse bias leakage current from the diodes $D_3$ and $D_4$, as indicated by the traces labeled $A_{ROW}$ and ROW, with the row address lines beginning their ascent at time $T_{1R}$, which may or may not coincide with time $T_{1C}$. The supply voltages, $V_{SUPPLY}$ and $V_{RETURN}$, are driven, respectively, positive and negative at times $T_{S1}$, and $T_{R1}$, which times may or may not coincide, as indicated by traces labeled $V_{SUPPLY}$ and $V_{RETURN}$.

At time $T_{2C}$, as the column address lines continue their descent, the positive supply voltage $V_{SUPPLY}$ has attained a level that, in combination with the descending column voltage COL, is sufficient to trigger $OTS_1$. With $OTS_1$ in a low impedance state, the positive supply voltage $V_{SUPPLY}$ is impressed upon the column node COL, as indicated by the upturn in the trace labeled COL at time $T_{2C}$. Similarly, at time $T_{2R}$, as the row address lines continue their ascent, the negative supply voltage $V_{RETURN}$ has attained a level that, in combination with the ascending row voltage ROW, is sufficient to trigger $OTS_3$. With $OTS_3$ in a low impedance state, the negative supply voltage $V_{RETURN}$ is impressed upon the row node ROW, as indicated by the downturn in the trace labeled ROW at time $T_{2R}$.

With the column voltage ascending and row voltage descending, the voltage across the cell $V_{CELL}$ (the difference between the two) increases. At some point, the cell voltage becomes sufficient to trigger the isolation OTS, $OTS_2$, and the cell's memory element OUM is accessed. The magnitude M, duration D and slope of the cell's voltage curve between times $T_{CELL3}$ and $T_{CELL4}$ can all play a part in determining the type of access that is carried out (e.g., a read access, write 00, 01, 10, or 11, for example). For example, as is known in the art, a relatively high magnitude access signal that is abruptly terminated may place the OUM in a high impedance state. A signal of the same magnitude that is gradually terminated may place the OUM in a low impedance state. A signal of lower magnitude, one that impresses less than a threshold voltage across the OUM, may be employed to read the state (e.g., high impedance, low impedance, intermediate impedance) of the memory element OUM. The magnitude, duration, and profile of the access signal ($V_{CELL}$) may be determined by a combination of positive-going pulses supplied by $V_{SUPPLY}$ and negative-going pulses supplied by $V_{RETURN}$ to provide a desired type of access (e.g., READ, WRITE 00, WRITE 01, etc.). At the conclusion of an access operation, all signals may be returned to their neutral state (1.5V in this illustrative embodiment).

For a write operation, the cell voltage $V_{CELL}$ is temporarily greater than or equal to the threshold voltage of the OTS device $OTS_2$ plus the threshold voltage of the memory element OUM (if the Ith of each both are relatively equal, and otherwise the Vcell may be less). For a read operation, the cell voltage $V_{CELL}$ is greater than the threshold voltage of the OTS device $OTS_2$, plus a voltage, such as 0.3V, that places the OUM in a read voltage regime even if it is reset (i.e., in the amorphous state). Such a read voltage regime is known in the art and described, for example, in published U.S. Application 2006/0279979 to Lowrey et al, which is hereby incorporated by reference.

As a further example, Vsupply may be in series with a read current source enabled during read that forces the read current through select devices OTS1 and OTS3 once they are triggered on, and thus into selected cell 104. If the current continues charging without a change in slope during read, the cell is in the amorphous state or high resistance state, and charging may be stopped before the OUM is thresholded through use of a voltage clamp, such as at voltage of Vots+0.5V. If the slope changes at a relatively low voltage compared to a bit in the amorphous state, the OUM is in a set or low resistance state.

In accordance with the principles of the present invention, for a READ operation, the supply voltage may be increased so that the cell voltage is greater than the total of the OUM by a voltage, such as 0.3V, in order to turn the $OTS_2$ on if the selected bit is in the set state, then, once the device $OTS_2$ begins conducting, the supply voltage may be lowered so that the cell voltage is greater than the Vh voltage of the OTS device $OTS_2$ plus a voltage that places the OUM in a read regime, and thus the resistance of the cell state may be detected. This approach may be implemented by use of a read current that thresholds to the OTS if the PCM is set, but uses a voltage clamp so the maximum voltage across the cell is less than that necessary to trigger the OUM (Vots+Voum) if the bit is reset. Such lowering may be accomplished by placing $V_{supply}$ in series with a read current source. Such current source or the supply voltage $V_{supply}$ may be a regulated voltage, such as a band-gap regulator, or supplied by a temperature-compensated and voltage compensated current source, for example. Such currents and voltages need not be the same voltage for READ, Write SET, and Write RESET operations, and can be designed to accommodate load and isolation devices as will be apparent to one reasonably skilled in the art. For example, to write, the voltage compliance may be increased as necessary to be great enough so that, even if the bit is reset, the OTS triggers to its holding voltage Vh. The current forced by the increased voltage compliance ensures that the PCM portion of the cell triggers and allows the write current to flow through the triggered PCM, as is required for a write operation.

Write set or reset may be accomplished by placing Vsupply in series with a current larger than a read current and adequate to melt the OUM to a temperature adequate to reset the element. Then, to write the bit to a reset state, the current may be turned off rapidly, such as in less than 10 nsec, if the alloy is G2S2T5. Or turn-off (quench) may be even faster if faster alloys are used, such as by use of a trailing edge less than 1 nsec. To write the element to a set state, the current amplitude may be the same as for reset, but may be turned off slowly for setting, such as with a linear slope greater than 500 nsec.

After write is accomplished, the $V_{supply}$ and Return voltages may be forced to V/2 by pre-charging, thereby turning off the column and row OTS devices and the array armed for the next cycle. Such pre-charging may be used advantageously to assist rapid quenching when writing to the reset (higher resistance) state.

Figure 3:
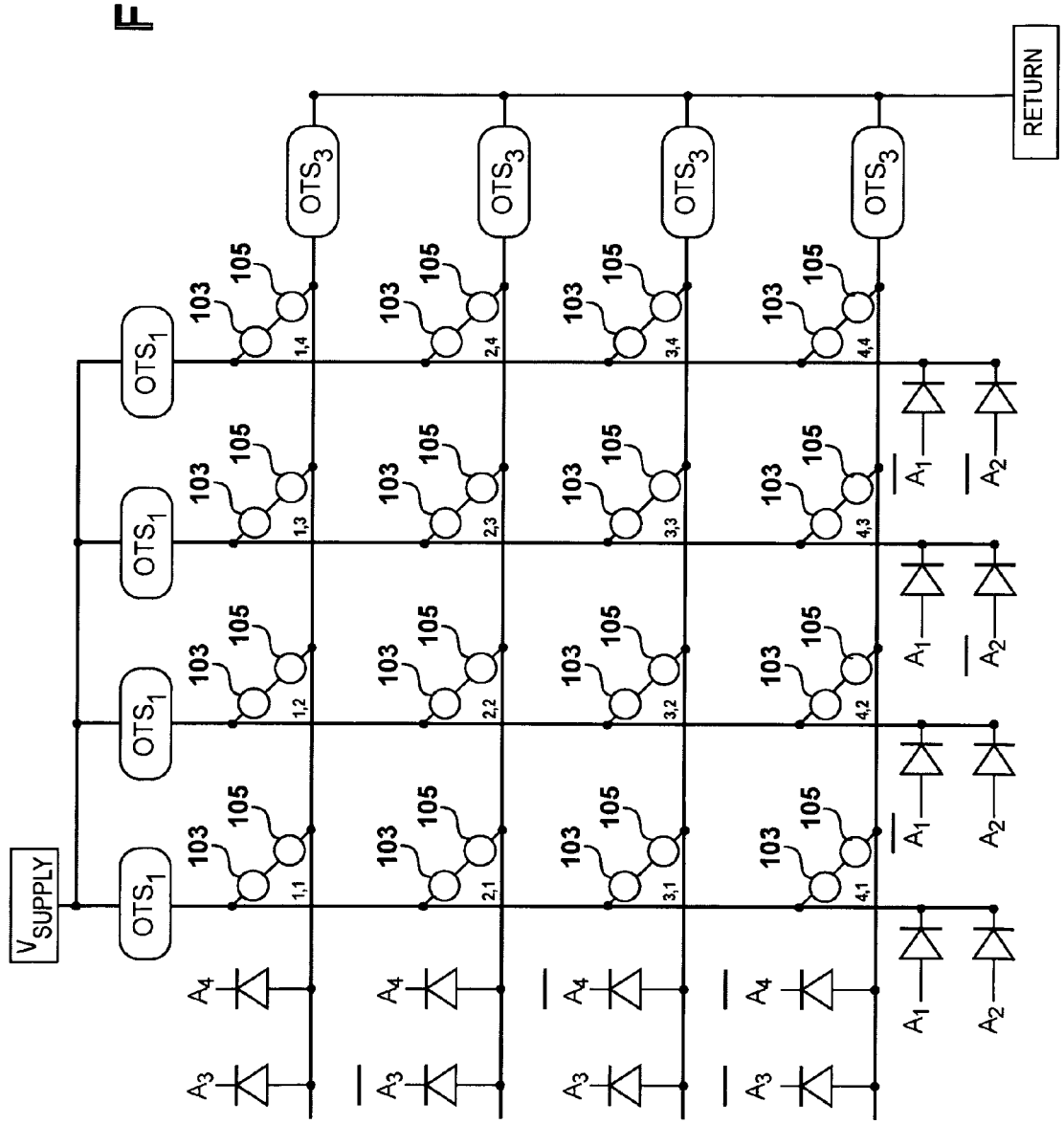
FIG. 3 is a depiction of a crossbar array of memory cells in accordance with the principles of the present invention.

The block diagram of FIG. 3 will be used to illustrate a decoding scheme in accordance with the principles of the present invention employed in an illustrative sixteen-cell crossbar memory array. Extension of the principles illustrated herein with respect to a small array such as this to larger arrays will be apparent to those skilled in the art. In the diagram of FIG. 3 each intersection (labeled row,column) represents a memory cell within an array. Address signals (labeled $A_i, A_j$) represent the signals supplied to the row and column decoding diodes associated with the memory cells. For example, address signals $A_3$ and $A_4$ are supplied to the four memory cells associated with row line 1 and address signals $A_1$ and $A_2$ are supplied to the four memory cells associated with column line 1, for example.

In this illustrative example, memory cell 1,1 is selected when $A_1=A_2$=Low and are driven low, such as by a current or voltage source, and $A_3=A_4$=High, such as by a current source or pullup voltage. That is, with signals $A_1$ and $A_2$ being supplied to column decode diodes, such as diodes $D_1$ and $D_2$ described in the discussion related to FIG. 1, driving both address signals low back-biases the diodes $D_1$ and $D_2$, which forces reverse bias leakage current thereby discharging the column node and, eventually, triggering the column OTS $OTS_1$ into a low impedance state (low dv/di) in series with its Vh, thereby impressing the positive supply voltage upon this selected column node (and thereby raising it), as previously described. With signals $A_3$ and $A_4$ being supplied high to row decode diodes, such as diodes $D_3$ and $D_4$ described in the discussion related to FIG. 1, driving both address signals high to back-bias the diodes $D_3$ and $D_4$, thereby charging the row node and, eventually, triggering the row OTS $OTS_3$ and thereby pulling it low by impressing the negative supply voltage upon the row node, as previously described. Because memory cell 1,1 is the only cell with both its column and row nodes thus-selected, it is the only cell accessed with this combination of address signals.

Similarly, in this illustrative example, memory cell 4,4 is selected when $A_{1BAR}=A_{2BAR}$=Low and $A_{3BAR}=A_{4BAR}$=High. That is, with signals $A_{1BAR}$ and $A_{2BAR}$ being supplied to column decode diodes, such as diodes $D_1$ and $D_2$ described in the discussion related to FIG. 1, driving both address signals low back-biases its decoder diodes, and thereby discharges the column node, thereby triggering its column OTS $OTS_1$ and impressing the positive supply voltage upon the column node, as previously described. With signals $A_{3BAR}$ and $A_{4BAR}$ being supplied to row decode diodes, such as diodes $D_3$ and $D_4$ described in the discussion related to FIG. 1, driving both address signals high back-biases the diodes $D_3$ and $D_4$, thereby charging the row node and, eventually, triggering the column OTS $OTS_3$ and impressing the negative supply voltage upon the row node, as previously described. Because memory cell 4,4 is the only cell with both its column and row nodes thus-selected, it is the only cell accessed with this combination of address signals. In an illustrative embodiment, all address lines $A_1, A_2, \ldots, A_n$ and their complements, $A_{1BAR}, A_{2BAR}, \ldots, A_{nBAR}$ are supplied to a memory in accordance with the principles of the present invention in order to facilitate thin-film transistor-free memory cell decoding in accordance with the principles of the present invention.

Thin-film transistor-free decoder/OTS driver combinations in accordance with the principles of the present invention may be employed within a memory in accordance with the principles of the present invention that employs a hierarchical architecture in which blocks of memory are distributed in an array. In an illustrative embodiment, each block of memory and each element within the block may be accessed through row and column address decoders, and multiple elements may be accessed by selecting multiple columns, rows, and/or blocks in parallel.

Figure 4:
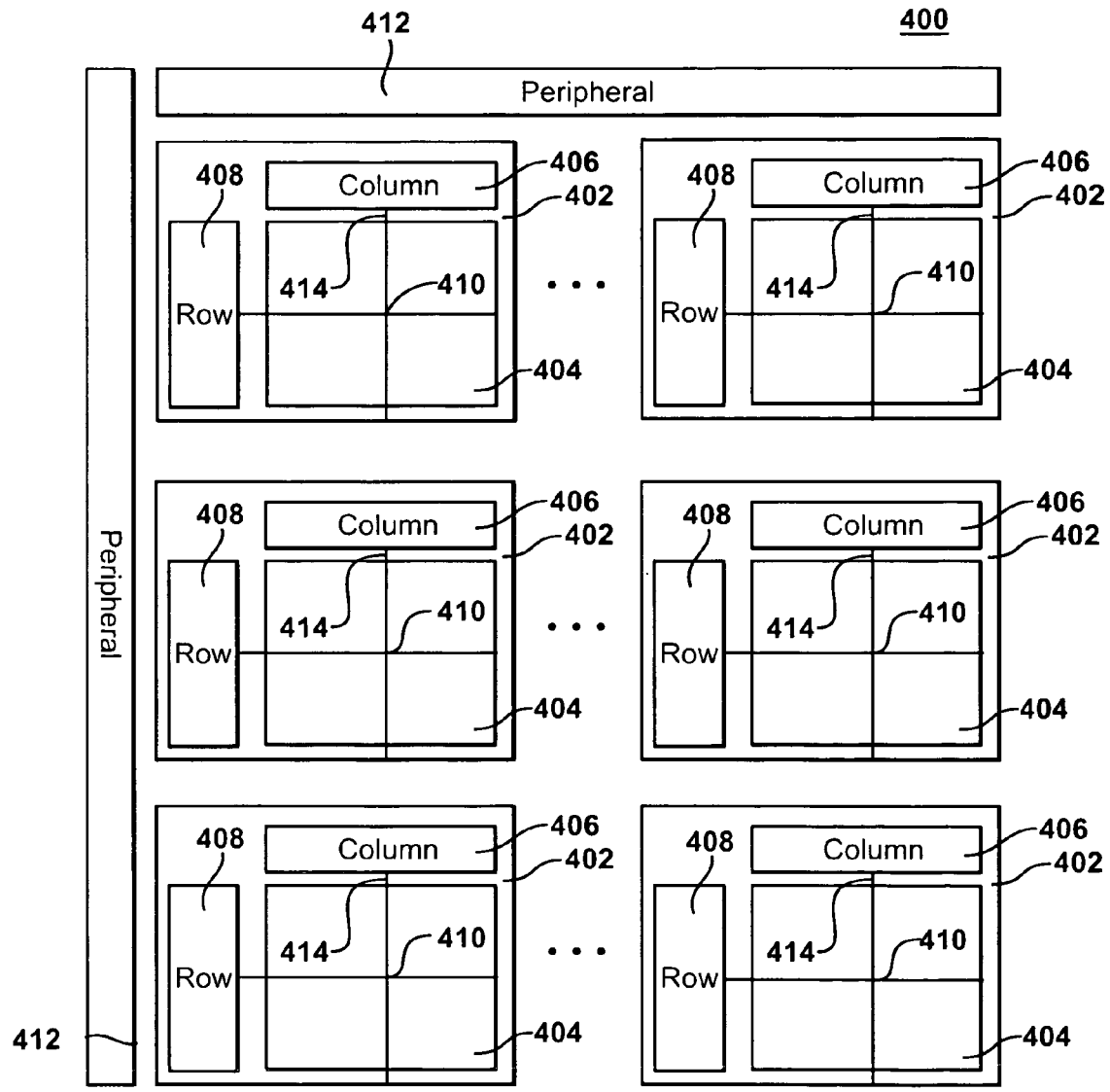
FIG. 4 is a block diagram of a hierarchical array of memory cells in accordance with the principles of the present invention.

In the conceptual block diagram of FIG. 4, a memory 400 is organized in an 8×8 array of 64 memory blocks 402. Each block includes an array of memory cells 404 and peripheral circuitry that includes column 406, and row 408 access circuitry that provide access to individual memory cells 410 within each block 402. Peripheral array circuitry 412 includes row and column decoders and drivers, data and address buffers, sense amplifiers and current sources. In an all-thin-film decoder, driver, and memory array embodiment in accordance with the principles of the present invention, peripheral logic circuitry may be limited, for example to row and column address drivers, row and column decoders, such as the thin-film transistor-free decoders described in the discussions related to previous figures. Other circuitry, such as sense amplifiers and current sources may be located "on" or "off-chip" on a memory controller, for example.

Within each block of memory, address signals (and their complements) are used to determine which element to access. In this illustrative embodiment, the memory employs different current/voltage sources for each operation, and, therefore, it (or a controller that includes the current and voltage sources) predetermines not just whether the element is to be read from or written to, but, additionally, that state it is being written to, whether a SET RESET, or intermediate levels if MLC (multiple bits stored per physical cell—thus determining which operation is to be performed upon user command.

In this illustrative embodiment each of the memory blocks 402 includes a row thin-film transistor-free decoder/OTS combination dedicated to each row within the memory block 402 and a column thin-film transistor-free decoder/OTS combination dedicated to each column within the memory block 402. However, combinations of some of these embodiments may be used with more traditional means to decode or drive the memory array. For example, a traditional transistor decoder could drive the row and the embodiment described herein could drive the column.

Figure 5:
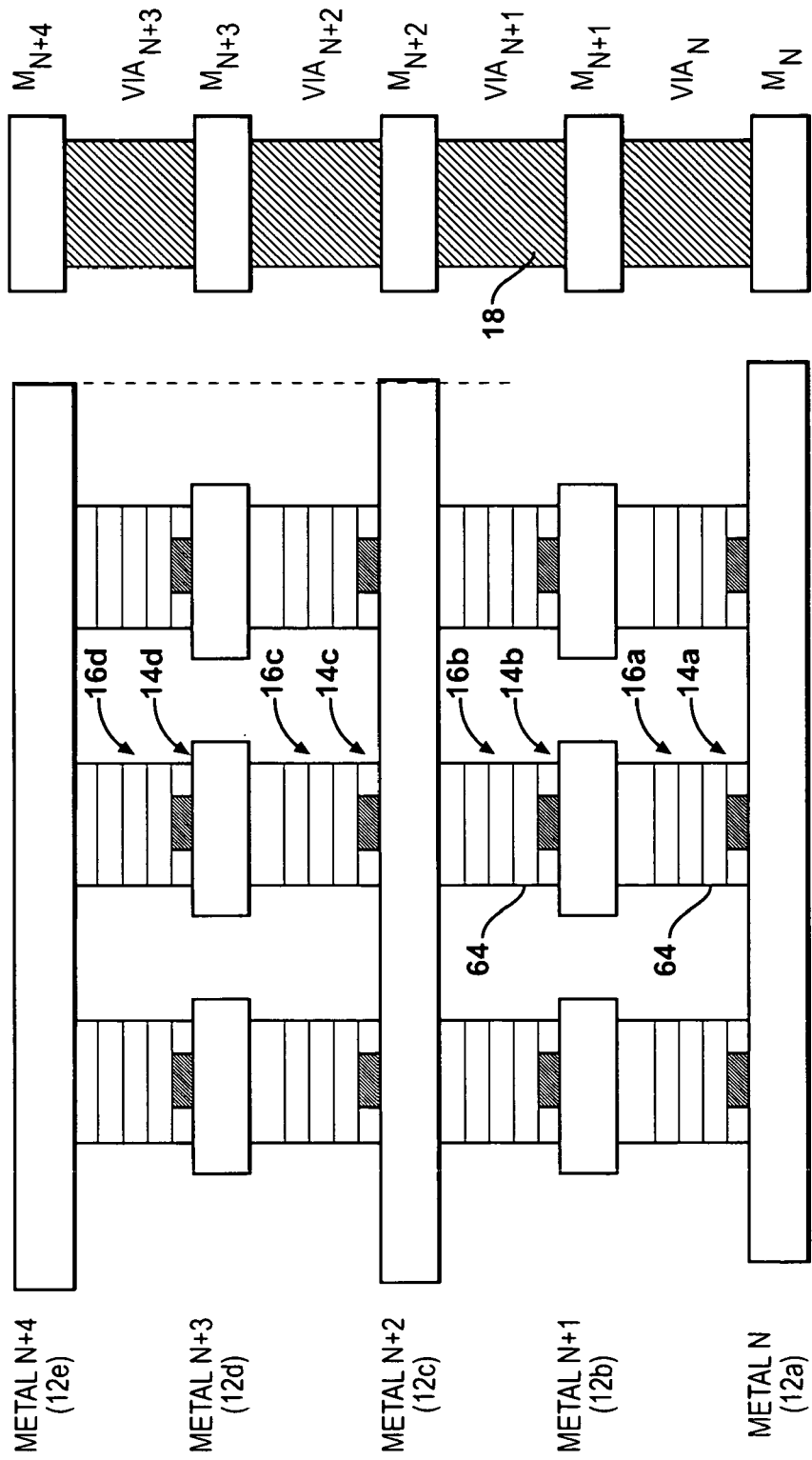
FIG. 5 is a cross section of a multi-layer stack of memory cells in accordance with the principles of the present invention.

Referring to FIG. 5, a memory 500 in accordance with the principles of the present invention may include thin-film memory devices and thin-film access devices, such as thin-film diodes or OTS devices, stacked one upon another. Because thin-film materials and processes are employed, the memory 500 may be deposited on a relatively inexpensive substrate 502 such as glass, ceramic, or other material; a conventional single crystal silicon substrate is not needed. Thin-film processing techniques also permit the stacking of such devices.

The phase change memory elements 14a-14d in FIG. 5 of this illustrative embodiment may be implemented by a series of layers provided underneath the selection devices 16a-16d. The memory elements 14a-14d and selection devices 16a-16d may be, respectively, phase change memories and thin-film access devices as described in the discussion related to the previous Figures. Vias 18 may be provided between adjacent levels to provide interconnection between wiring conductors on those levels.

In this illustrative stacked thin-film memory, addressing lines are shared. For example, line 12d, is shared between directly overlying cells (including the element 14d and the selection device 16d), providing a rowline to those cells; and directly underlying cells (including the selection device 16c and the memory element 14c), providing a column line to those cells. Similarly, the line 12c functions for selection of the directly overlying cells (including the selection device 16c and the memory element 14c), providing a rowline to those cells; as well as for selection of the memory cells directly underlying line 12c including memory element 14b and selection device 16b, providing a column line to those cells.

Stacking of thin-film memory devices and shared addressing lines are known and described in published patent application 2006/0120136 entitled, "SHARED ADDRESSE LINES FOR CROSSPOINT MEMORY," and in U.S. Pat. No. 6,795,338, entitled "Memory Having Access Devices Using Phase Change Material Such As Chalcogenide," which are hereby incorporated by reference. Such means may be utilized with the embodiments herein where the stacked layers may also include the thin-film diode decoders with the OTS drivers. Similarly, the diodes may be replaced by OTS drivers of different trigger voltage optimized for margin relative to the threshold of the OTS driver or memory cell ots, such as by adjusting the thickness of each.

The formation of each layer, such as metal layer N, typically requires several process steps. Such process steps may include: deposition, lithography, etching, cleaning, dielectric deposition, and planarization, for example. Conventional memories, which rely upon single-crystal circuitry to perform memory access functions such as address-decoding, have had to rely upon dramatically increased numbers of mask steps (along with ancillary steps just described) in order to achieve greater memory densities. A conventional single-crystal memory of 128 Mbit or more requires at least thirty mask steps. Each additional mask step adds significantly to the cost of production, limits production flexibility, decreases reliability, increases production cycletimes, and increases inventory costs. Because all access devices and access circuitry, such as address decoding circuitry, is contiguous with the substrate in a single-crystal memory device, additional metal layers (and associated mask and ancillary steps) may be required to route address and data lines to memory cells. As features sizes shrink, conventional single-crystal circuitry, including memory devices and peripheral memory circuitry must include isolation features, such as implant regions. Such isolation regions require additional process steps including: mask, trench etch, clean, implant, clean, dielectric fill, and planarization.

Memory cells in a standalone all-thin-film memory in accordance with the principles of the present invention are self-isolating (being surrounded, for example, by insulator material such as $SiO_2$) and, therefore, avoid the additional process steps required of conventional single-crystal memory and hybrid memories that employ single-crystal circuits, such as decoders and select devices, in combination with thin-film memory cells. By eliminating conventional single-crystal devices a standalone thin-film memory in accordance with the principles of the present invention eliminates the multiple mask steps associated with the formation of n-channel MOSFETs, with the formation of p-channel MOSFETs, with the isolation of n-channel MOSFETS, with the isolation of p-channel MOSFETS, and with the interconnection to these devices. Additionally, by off-loading a substantial amount of memory support functions to a controller, the complexity of a standalone thin-film memory in accordance with the principles of the present invention may be substantially less than a conventional memory of the same capacity.

In an illustrative embodiment, a standalone thin-film memory in accordance with the principles of the present invention includes only a thin-film memory array, thin-film access devices, thin-film decoding, and thin-film drivers for input/output operations; all other functions are executed by a controller adapted to controlling one or more standalone thin-film memories in accordance with the principles of the present invention. By eliminating the complexity associated with a memory that includes peripheral support circuits, along with a memory array and access circuits, a standalone thin-film memory in accordance with the principles of the present invention avoids the use of additional metal layers (for example, three to five metal layers, each requiring two to four mask steps) often required to interconnect conventional, complex, single-crystal memories.

Even hybrid thin-film/single-crystal memories, which employ a single-crystal substrate that includes single-crystal circuitry such as address-decoding circuitry, may be forced to use more mask steps in order to route address and data lines to memory cells.

A memory in accordance with the principles of the present invention may reduce the number of mask steps required for each complete memory layer of 128 Mbit or more. In some embodiments, an all-thin-film memory in accordance with the principles of the present invention may reduce the number of mask steps required for the formation of a complete memory layer of 128 Mbit or more. By sharing interconnect layers, as in the stacked embodiment of FIG. 5, the number of layer, and associated mask steps per layer of memory, can be reduced even further.

Stacking of thin-film memory devices and shared addressing lines are known and described in published patent application 2006/0120136 entitled, "SHARED ADDRESSE LINES FOR CROSSPOINT MEMORY," and in U.S. Pat. No. 6,795,338, entitled "Memory Having Access Devices Using Phase Change Material Such As Chalcogenide," which are hereby incorporated by reference.

Figure 6:
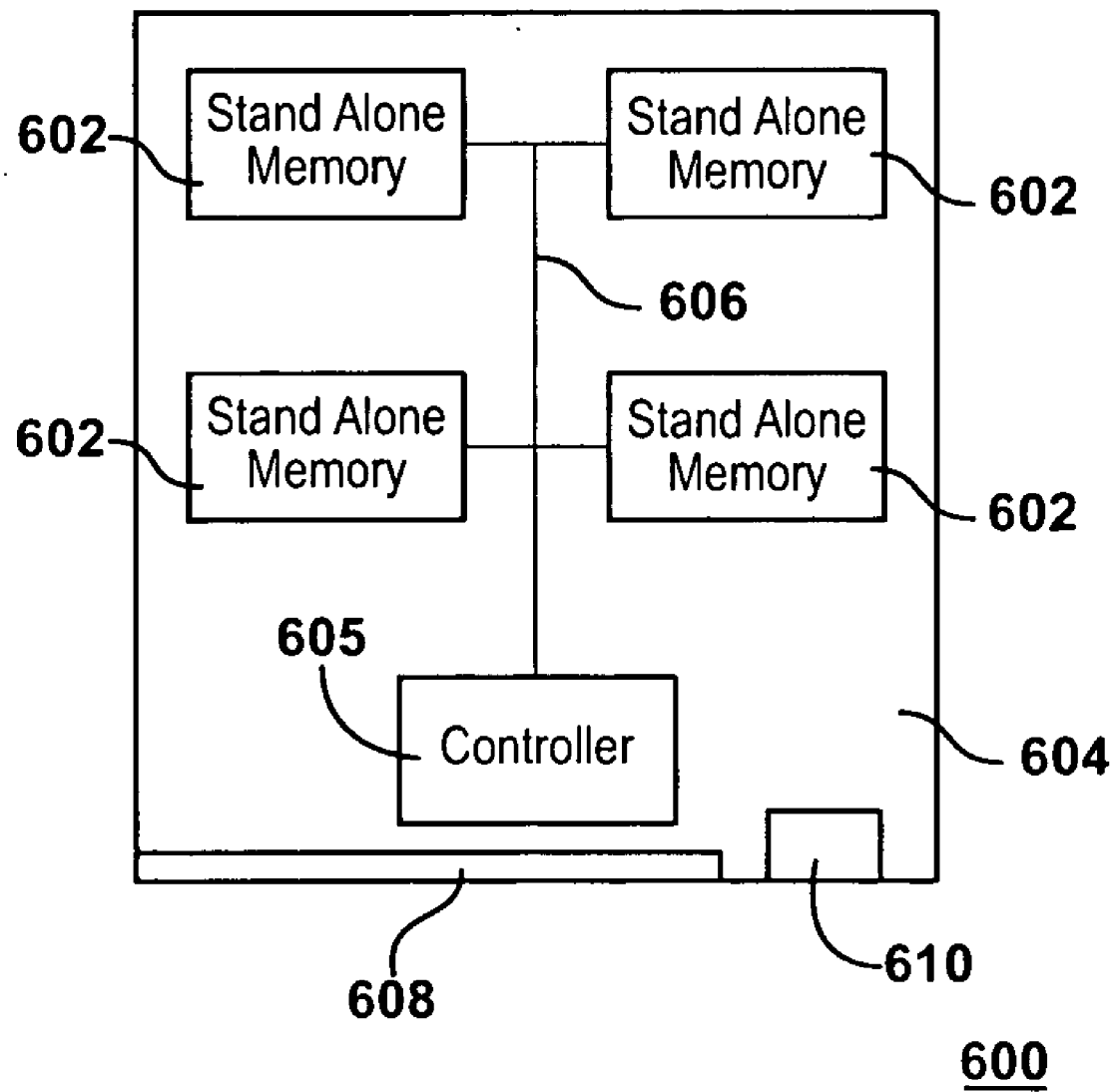
FIG. 6 is a block diagram of a memory system employing a memory in accordance with the principles of the present invention.

In the illustrative embodiment of FIG. 6 a memory system 600 in accordance with the principles of the present invention includes one or more thin-film memories 602 deposited on a standard crystalline or non-crystalline substrate 604. Such a non-crystalline substrate 604 may be a surface mount PC board, for example. A plurality of standalone memory devices 602 in accordance with the principles of the present invention may be joined via interconnecting conductive lines 606 patterned on the substrate. Conductive interconnecting lines may be patterned in a multilayer substrate, in order to connect components through conductive lines situated on different layers of the substrate, for example.

A memory controller 605 may be formed on the same substrate 604 and configured to operate the standalone memories 602 in a manner previously described. The memory controller may be formed using a conventional CMOS process, then connected to the standalone memories formed on the non-crystalline substrate through processes such as those employed in hybrid circuit manufacture, for example. The memory system 600 may communicate with other components using conventional interconnection components, such as edge connector 608 or other self-contained connector 610 which may be a high speed optical or coaxial connector, for example.

The phase change electronic device(s) and control/OTS driver embodiment described in the discussion related to the previous figures may be employed to particular advantage in a wide variety of systems. The schematic diagram of FIG. 7 will be employed to illustrate the devices' use in a few such systems. The schematic diagram of FIG. 7 includes many components and devices, some of which will be used for specific embodiments of a system in accordance with the principles of the present invention and others not. In other embodiments, other similar systems, components and devices may be employed. In general, the system includes logic circuitry configured to operate along with phase change memory. The logic circuitry may be discrete, programmable, application-specific, or in the form of a microprocessor, for example. And the embodiments herein may also be employed within the chips or connected to such circuitry.

Figure 7:
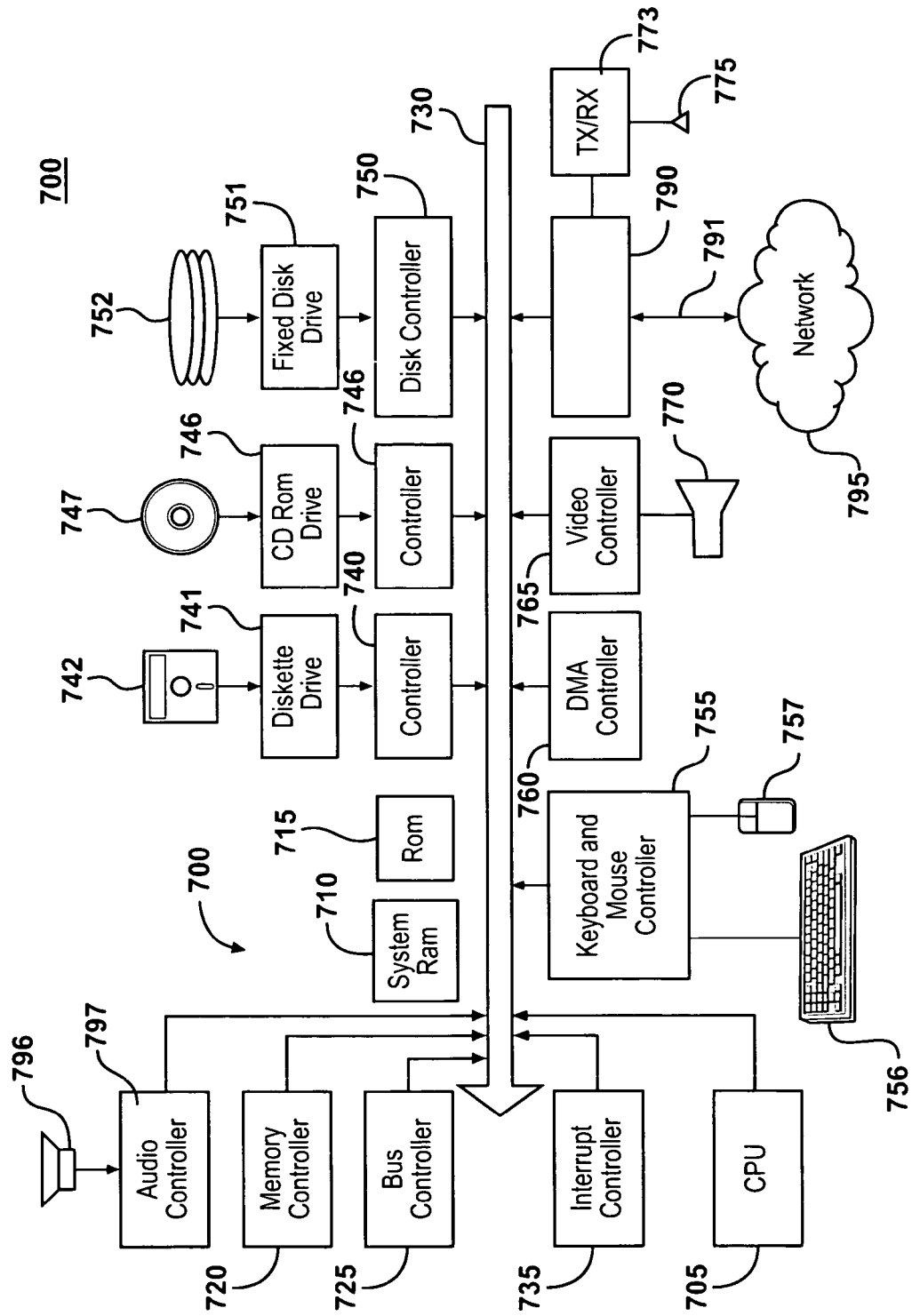
FIG. 7 is a block diagram of a system that includes memory in accordance with the principles of the present invention.

The exemplary system of FIG. 7 is for descriptive purposes only. Although the description may refer to terms commonly used in describing particular computer, communications, tracking, and entertainment systems, the description and concepts equally apply to other systems, including systems having architectures dissimilar to that illustrated in FIG. 7. The electronic system 700, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, or a radio frequency identification device. Any or all of the components depicted in FIG. 7 may employ a thin-film transistor-free decoder/OTS driver within the components, or within a phase change memory or chalcogenide electronic device, such as a chalcogenide-based nonvolatile memory or threshold switch, for example, that are embedded within the components.

In an illustrative embodiment, the system 700 may include a central processing unit (CPU) 705, which may be implemented with some or all of a microprocessor, a random access memory (RAM) 710 for temporary storage of information, and a read only memory (ROM) 715 for permanent storage of information. A memory controller 720 is provided for controlling RAM 710. In accordance with the principles of the present invention, all of, or any portion of, any of the memory elements (e.g. RAM or ROM) may be implemented using the thin-film transistor-free decoder/OTS driver embodiment described herein, either as chalcogenide-based nonvolatile memory, or with other types of memory or components.

An electronic system 700 in accordance with the principles of the present invention may be a microprocessor that operates as a CPU 705, in combination with embedded chalcogenide-based electronic thin-film transistor-free decoder/OTS driver used with or without nonvolatile memory that operates as RAM 710 and/or ROM715, or as a portion thereof. In this illustrative example, the microprocessor and thin-film transistor-free decoder/OTS combination may be standalone, or may operate with other components, such as those of FIG. 7 yet-to-be described.

In implementations within the scope of the invention, a bus 730 interconnects the components of the system 700. A bus controller 725 is provided for controlling bus 730. An interrupt controller 735 may or may not be used for receiving and processing various interrupt signals from the system components. Such components as the bus 730, bus controller 725, and interrupt controller 735 may be employed in a large-scale implementation of a system in accordance with the principles of the present invention, such as that of a standalone computer, a router, a portable computer, or a data storage system, for example.

Mass storage may be provided by diskette 742, CD ROM 747, or hard drive 752. Such mass storage may utilize the embodiments described herein. Data and software may be exchanged with the system 700 via removable media such as diskette 742 and CD ROM 747. Diskette 742 is insertable into diskette drive 741 which is, in turn, connected to bus 730 by a controller 740. Similarly, CD ROM 747 is insertable into CD ROM drive 746 which is, in turn, connected to bus 730 by controller 745. Such components may utilize the thin-film transistor-free decoder/OTS herein to drive loads within or off the chip. Hard disc 752 is part of a fixed disc drive 751 which is connected to bus 730 by controller 750. Although conventional terms for storage devices (e.g., diskette) are being employed in this description of a system in accordance with the principles of the present invention, any or all of the components or storage devices may be implemented using chalcogenide-based thin-film transistor-free decoder/OTS drivers in accordance with the principles of the present invention. Removable storage may be provided by a nonvolatile storage component, such as a thumb drive, that employs a chalcogenide-based thin-film transistor-free decoder/OTS driver with or without nonvolatile memory in accordance with the principles of the present invention as the storage medium. Storage systems that employ chalcogenide-based nonvolatile memory as "plug and play" substitutes for conventional removable memory, such as disks or CD ROMs or thumb drives, for example, may emulate existing controllers to provide a transparent interface for controllers such as controllers 740, 745, and 750, for example.

User input to the system 700 may be provided by any of a number of devices. For example, a keyboard 756 and mouse 757 are connected to bus 730 by controller 755. An audio transducer 796, which may act as both a microphone and a speaker, is connected to bus 730 by audio controller 797, as illustrated. Other input devices, such as a pen and/or tabloid may be connected to bus 730 and an appropriate controller and software, as required, for use as input devices. DMA controller 760 is provided for performing direct memory access to RAM 710, which, as previously described, may be implemented in whole or part using chalcogenide-based thin-film transistor-free decoder/OTS drivers with or without nonvolatile memory devices in accordance with the principles of the present invention. A visual display is generated by video controller 765 which controls display 770. The display 770 may be of any size or technology appropriate for a given application.

In a cellular telephone or portable entertainment system embodiment, for example, the display 770 may include one or more relatively small (e.g. on the order of a few inches per side) LCD displays. In a large-scale data storage system, the display may implemented as large-scale multi-screen, liquid crystal displays (LCDs), or organic light emitting diodes (OLEDs), including quantum dot OLEDs, for example. Any such components or devices may use thin-film transistor-free decoder/OTS drivers with or without nonvolatile memory devices in accordance with the principles of the present invention.

The system 700 may also include a communications adaptor 790 which allows the system to be interconnected to a local area network (LAN) or a wide area network (WAN), schematically illustrated by bus 791 and network 795. An input interface 799 operates in conjunction with an input device 793 to permit a user to send information, whether command and control, data, or other types of information, to the system 700. The input device and interface may be any of a number of common interface devices, such as a joystick, a touch-pad, a touch-screen, a speech-recognition device, or other known input device. Any such components or devices may use thin-film transistor-free decoder/OTS drivers with or without nonvolatile memory devices in accordance with the principles of the present invention. In some embodiments of a system in accordance with the principles of the present invention, the adapter 790 may operate with transceiver 773 and antenna 775 to provide wireless communications, for example, in cellular telephone, RFID, and wifi computer implementations. Any such components or devices may use thin-film transistor-free decoder/OTS drivers with or without nonvolatile memory devices in accordance with the principles of the present invention.

Operation of system 700 is generally controlled and coordinated by operating system software. The operating system controls allocation of system resources and performs tasks such as processing scheduling, memory management, networking, and I/O services, among things. In particular, an operating system resident in system memory and running on CPU 705 coordinates the operation of the other elements of the system 700.

In illustrative handheld electronic device embodiments of a system 700 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 755, keyboard 756 and mouse 757, for example. Embodiments with a transmitter, recording capability, etc., may also include a microphone input (not shown).

In an illustrative RFID transponder implementation of a system 700 in accordance with the principles of the present invention, the antenna 775 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 773 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a chalcogenide-based nonvolatile memory in accordance with the principles of the present invention. In this illustrative embodiment, data read out from the memory is transferred to the transceiver 773 as an "answerback" signal on the antenna 775 at a second carrier frequency $F_2$. In passive RFID systems power is derived from the interrogating signal and memory such as provided by a chalcogenide-based thin-film transistor-free decoder/OTS driver with or without nonvolatile memory in accordance with the principles of the present invention is particularly well suited to such use.

I claim:

1. An apparatus comprising:
   a thin-film transistor-free address decoder, the decoder comprising one or more diodes in a reverse-biased state; and
   a thin-film memory cell, wherein the thin-film transistor-free address decoder is configured to select the thin-film memory cell in response to leakage current from a reverse-biased decoder diode.

2. The apparatus of claim 1, wherein the leakage current triggers a first ovonic threshold switch (OTS) device and thereby exposes a first terminal of the thin-film memory cell to a first access signal.

3. The apparatus of claim 2, wherein the leakage current triggers a second OTS device and thereby exposes a second terminal of the thin-film memory cell to a second access signal.

4. The apparatus of claim 2, wherein the first access signal is a voltage source signal.

5. The apparatus of claim 2, wherein the first access signal is a current source signal.

6. An apparatus comprising:
   a thin-film transistor-free address decoder, the decoder comprising one or more diodes in a reverse-biased state; and
   a thin-film memory cell, the thin-film memory cell including a phase-change memory element;
   wherein the thin-film transistor-free address decoder is configured to select the thin-film memory cell in response to leakage current from the reverse-biased decoder diodes.

7. An apparatus comprising:
   a thin-film transistor-free address decoder, the decoder comprising one or more diodes in a reverse-biased state; and a thin-film memory cell, the thin-film memory cell including a chalcogenide memory element;
wherein the thin-film transistor-free address decoder is configured to select the thin-film memory cell in response to leakage current from the reverse-biased decoder diodes.

8. The apparatus of claim 7, wherein the thin-film memory cell includes an ovonic threshold switch (OTS) device in series with the chalcogenide memory element, the OTS device configured as an isolation device.

9. The apparatus of claim 7, wherein the thin-film memory cell includes a diode in series with the chalcogenide memory element, the diode configured as an isolation device.

10. The apparatus of claim 3, wherein the first terminal of the thin-film memory cell is configured as a column node shared by a plurality of thin-film memory cells within an array of thin-film memory cells.

11. The apparatus of claim 10, wherein the second terminal of the thin-film memory cell is configured as a row node shared by a plurality of thin-film memory cells within the array of thin-film memory cells.

12. The apparatus of claim 1, wherein the thin-film transistor-free address decoder includes a plurality of ovonic threshold switch (OTS) devices configured to provide access to the thin-film memory cell with the leakage current.

13. The apparatus of claim 12, wherein the leakage current triggers an a first OTS device to expose a first terminal of the selected thin-film memory cell to a first access signal.

14. The apparatus of claim 13, wherein the leakage current triggers a second OTS device to expose a second terminal of the selected thin-film memory cell to a second access signal.

15. The apparatus of claim 13, wherein the first access signal is a voltage signal.

16. The apparatus of claim 11, wherein the thin-film memory cell includes a phase change memory element.

17. The apparatus of claim 16, wherein the thin-film memory cell includes a chalcogenide memory element.

18. The apparatus of claim 17, wherein the thin-film memory cell includes an OTS device in series with the chalcogenide memory element, the OTS device configured as an isolation device.

19. The apparatus of claim 13, wherein the first terminal of the thin-film memory cell is configured as a column node shared by a plurality of thin-film memory cells within an array of thin-film memory cells.

20. The apparatus of claim 19, wherein the second terminal of the thin-film memory cell is configured as a row node shared by a plurality of thin-film memory cells within the array of thin-film memory cells.

21. A standalone memory device comprising:
thin-film memory cells arranged in a cross-point array; and
thin-film peripheral circuitry including a transistor-free thin-film address decoder configured to access the thin-film memory cells, the thin film address decoder comprising an ovonic threshold switch (OTS) triggered by reverse-biasing a diode that couples an address line to a column line.

22. A standalone memory device comprising:
thin-film memory cells arranged in a cross-point array; and
thin-film peripheral circuitry including a transistor-free thin-film address decoder configured to access the thin-film memory cells, the thin film address decoder comprising an ovonic threshold switch (OTS) triggered by reverse-biasing a diode that couples an address line to a row line.

23. A method comprising:
connecting a plurality of diodes to a row of memory cells within a memory array;
reverse biasing all of the diodes connected to the row; and
employing the reverse-bias current of the diodes to trigger an ovonic threshold switch (OTS) device to thereby access a memory cell within the row of memory cells.

24. The method of claim 23, further comprising:
connecting a plurality of diodes to a column of memory cells within a memory array;
reverse biasing all of the diodes connected to the column; and employing the reverse-bias current of the diodes to trigger an OTS device to thereby access a memory cell within the column of memory cells.

25. The apparatus of claim 1, further comprising:
a microprocessor configured to access the thin-film memory cell through the thin-film transistor-free address decoder.

* * * * *